United States Patent [19]

Roas et al.

[11] Patent Number: 5,212,148
[45] Date of Patent: May 18, 1993

[54] METHOD FOR MANUFACTURING OXIDE SUPERCONDUCTING FILMS BY LASER EVAPORATION

[75] Inventors: Bernhard Roas, Erlangen; Gerhard Endres, Forchheim; Ludwig Schultz, Bubenreuth, all of Fed. Rep. of Germany

[73] Assignee: Siemens Aktiengesellschaft, Munich, Fed. Rep. of Germany

[21] Appl. No.: 347,246

[22] Filed: May 3, 1989

[30] Foreign Application Priority Data

May 11, 1988 [DE] Fed. Rep. of Germany ....... 3816192

[51] Int. Cl.$^5$ .......................... B05D 3/06; B05D 5/12
[52] U.S. Cl. ........................................ 505/1; 505/732; 505/730; 505/742; 427/596; 427/62; 427/314
[58] Field of Search ................ 427/53.1, 62, 63, 314, 505/1, 427/596; 505/732, 818, 819, 730, 742

[56] References Cited

PUBLICATIONS

Wu et al., "Low-temperature preparation of high Tc superconducting thin films", Appl. Phys. Lett. 52(9) Feb. 1988, pp. 754–756.
Appl. Phys. Lett., vol. 51, No. 26, 28, Dec. 1987, pp. 2263–2265.
Appl. Phys. Lett., vol. 51, No. 22, 30, Nov. 1987, pp. 1845–1847.
Appl. Phys. Lett., vol. 51, No. 11, Sep. 14, 1987, pp. 861–863.
Europhys. Lett., vol. 3, No. 12, Jun. 15, 1987, pp. 1301–1307.
Appl. Phys. Lett., vol. 51, No. 8, Aug. 24, 1987, pp. 619–621.
Supercond. News, vol. 1, No. 9, Mar. 18, 1988, pp. 1–5 and 13–16.
SPIE, vol. 735, Pulse Power for Lasers (1987), pp. 50–54.

*Primary Examiner*—Shrive Beck
*Assistant Examiner*—Roy V. King
*Attorney, Agent, or Firm*—Kenyon & Kenyon

[57] ABSTRACT

A method of manufacturing a layer of a superconducting high-$T_c$-material. For this purpose, an appropriate target material is deposited on a predetermined substrate by a pulsed laser with a wavelength in the ultraviolet range and, by applying a heat treatment and an oxygen treatment, the desired superconducting metal-oxide phase is formed with an ordered crystal structure. The heat treatment and oxygen treatment are performed simultaneously during the vaporizing step, whereby a power density of the laser radiation of over 3 J/cm$^2$ at the target material is provided, the pulse power of the laser is at least 1.5 J/pulse, the temperature of the substrate is raised to 600° C. to 800° C., and an oxygen atmosphere of between 0.02 mbar and 1 mbar is provided.

18 Claims, 1 Drawing Sheet

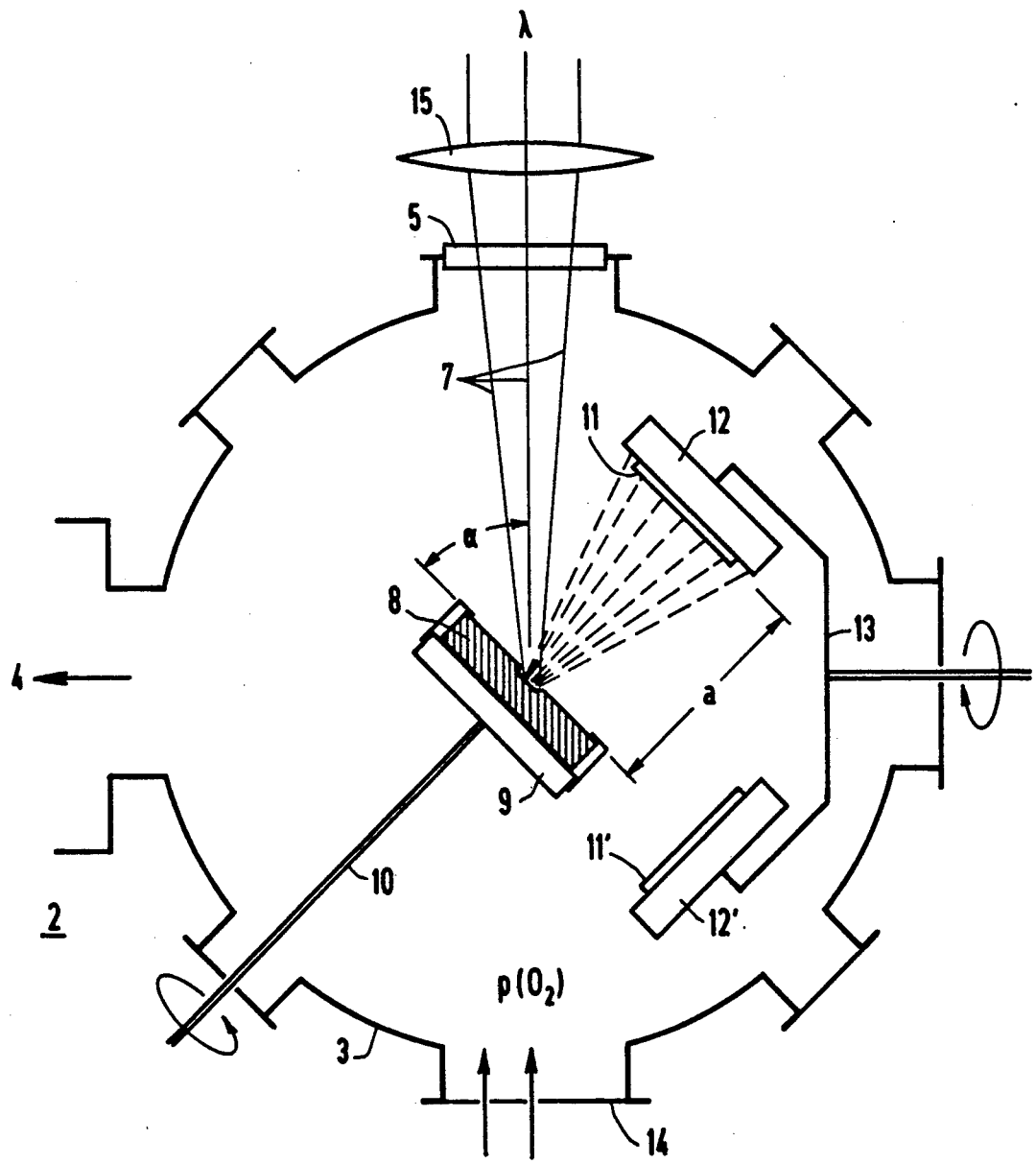

METHOD FOR MANUFACTURING OXIDE SUPERCONDUCTING FILMS BY LASER EVAPORATION

BACKGROUND OF THE INVENTION

The present invention relates to a method for manufacturing a layer of an oxide-ceramic superconductor material with a high superconducting transition temperature and high current capacity, on the basis of a system containing metallic constituents and oxygen, whereby a target material of the system is vaporized and deposited on a predetermined substrate by means of a pulsed laser with a wavelength in the ultraviolet spectral range, and whereby, by applying a heat treatment and an oxygen treatment, the desired superconducting metal-oxide phase is formed with an at least partially ordered crystal structure. A corresponding method proceeds, for example, from the publication "Applied Physics Letters", Vol. 51, No. 11, Sep. 14, 1987, pages 861 to 863.

Superconductive metal-oxide compounds are generally known with high superconducting transition temperatures $T_c$ of especially over 90 K. These metal-oxide compounds can be based, for example, on a system of the Me1-Me2-Cu-O type, whereby the constituent Me1 contains at least a rare earth metal, such as for example Y, and Me2 contains at least an alkaline-earth metal, such as for example Ba. Films or thin layers made of these metal-oxide compounds are often manufactured using special vaporization or sputtering processes. Hereby, a polycrystalline or amorphous initial product with the constituents of the selected system is generally first deposited on a suitable substrate, whereby the oxygen content and consequently, the desired phase are usually not yet exactly established. This initial product is then converted, by applying a heat and oxygen treatment, into the material with the desired superconducting phase.

The superconductive metal-oxide phases, to be obtained in this manner, can have perovskite-like crystal structures and, in the case of $YBa_2Cu_3O_{7-x}$, whereby $O<x<0.5$, have an orthorhomic structure (compare, for example, "Europhysics Letters", Vol. 3, No. 12, Jun. 15, 1987, pages 1301 to 1307). Their superconducting transition temperature $T_c$ lies, thereby, at approximately 90 K. Since the materials showing these superconducting phases are to be classed with oxide-ceramics, the corresponding high-T superconductors are also often designated as oxide-ceramic superconductors.

Manufacturing single-crystal films of the $YBa_2Cu_3O_{7-x}$ system on a single-crystal $SrTiO_3$ substrate by way of epitaxy is a known procedure from the publication mentioned above, "Applied Physics Letters". For this purpose, a target material of the mentioned system is first vaporized by a laser and separated on to the substrate with the ordered crystal structure The laser used in this instance is a KrF-excimer laser with a wavelength of radiation in the ultraviolet (uv) spectral range. It can be focused to produce a power density at the target material of approximately 2 J/cm², at a pulse frequency of 3 to 6 Hz. The subtrate is thereby heated to 450° C. (compare also "Appl.Phys.Lett.", Vol. 51, No. 8, Aug. 24, 1987, pages 619 to 621). However, the layer obtained in this manner is still defectively structured, as far as the desired superconducting high-$T_c$ phase is concerned. By following with a heat treatment at a high temperature of approximately 900° C. in an oxygen atmosphere and, with a subsequent slow cooling, one then obtains epitactically grown single-crystal or at least heavily textured film layers with the desired superconducting high-$T_c$ phase.

Such film layers distinguish themselves by high critical current densities, which at 77 K can amount to over $10^5$ A/cm². The mentioned epitaxy is thereby considered as a prerequisite for attaining such high, critical current densities. However, using the known method to manufacture the appropriate layers entails considerable expenditure. In addition, the epitaxy, which takes place in the high temperature process is difficult to control. In particular, an interdiffusion between the film material and the substrate cannot be avoided in many cases.

SUMMARY OF THE INVENTION

An object of the present invention is to provide a method of the type mentioned in the beginning, to the effect that appropriate layers can be manufactured with reproducibility, in a relatively simple way, with critical current densities of at least $10^4$ A/cm², close to the superconducting transition temperature $T_c$, without necessitating the mentioned high-temperature process.

The above and other objects of the invention are achieved by a method for manufacturing a layer of an oxide-ceramic superconductor material with a high superconducting transition temperature and high current capacity, on the basis of a system containing metallic constituents and oxygen, whereby a target material of the system is deposited on a wavelength in the ultraviolet spectral range, and whereby, by applying a heat treatment and an oxygen treatment, the desired superconducting metal-oxide phase is formed with an at least partially ordered crystal structure, wherein the heat treatment and the oxygen treatment are performed simultaneously during the vaporizing step, whereby the following steps are provided:

a) a power density of the laser radiation deposited at the target material of more than 3 J/cm², b) a pulse power of the laser of at least 1.5 J/pulse, c) a temperature rise of the substrate to a temperature of between 600° C. and 800° C., and d) an atmosphere with a partial pressure of oxygen ($p(O_2)$) of between 0.02 mbar and 1 mbar.

The advantages which are achieved with the measures, according to the invention, are especially evident, in that quasi "in situ", one can obtain a crystallization of the desired superconducting phase. Therefore, a subsequent development of this phase with a separate annealing step at high temperatures is no longer required. The method can, therefore, especially be used to form hybrid structures of semi-conductive and superconductive material. Moreover, superconductive electronic components with generally known elements, such as, for example, Josephson tunnel elements or SQUIDs can be manufactured with this method.

Higher substrate temperatures and activated oxygen on the substrate are necessary for the in-situ crystallization, according to the invention. To activate the oxygen, a high as possible pulse power of the laser of at least 1.5 J/pulse is required. The molecular oxygen of the provided atmosphere is then activated at the specified compression ratios, by interacting with the ultra violet laser radiation, with every pulse, directly on the heated substrate. The quantity of oxygen radicals, which is hereby generated, and the high substrate temperature are sufficient to allow an approximately 1 nm thick layer to grow epitactically, with every pulse. The high growth rates achieved with standard pulse frequencies guarantee a short vaporization duration and a minimal amount of impurities in the layers. To maintain the stoichiometry in the vaporization process, a power density of the laser radiation of over 3 J/cm² is advantageously provided.

With the method according to the invention, there is at least one thin layer or at least one film from a known superconducting high-$T_c$-material to be deposited on a substrate. As an exemplified embodiment, a material from the Me1-Me2-Cu-O system is selected. However, the method, according to the invention, is not only restricted to this system, it is suited just as well for other high-$T_c$ superconducting materials, which are not classed with the mentioned system and which contain oxide-ceramic, metallic constituents and oxygen. Appropriate materials are known, for example, from "Superconductivity News", Vol. 1, No. 9, Mar. 18, 1988, pages 1 to 5 and 13 to 16. The layers from the mentioned oxide-ceramic superconductive materials, which are to be manufactured with the method, according to the invention, should thereby guarantee a high current capacity in the magnitude of at least $10^4$ A/cm², close to the superconducting transition temperature $T_c$ of the material. Materials are especially advantageous, which have a superconducting transition temperature that is clearly above the evaporation temperature of liquid nitrogen of approximately 77 K.

BRIEF DESCRIPTION OF THE DRAWING

The invention will be described in greater detail in the following detailed description with reference to the single drawing figure which shows schematically a device to implement the method.

DETAILED DESCRIPTION

As an exemplified embodiment, a material of the composition Me1-Me2-Cu-O is selected, whereby Me1 is especially selected out of the group of rare earth metals, such as for example Y, and Me2 is selected from the group of the alkaline-earth metals, such as for example Ba. Suitable materials are generally known, apart from Y and Ba, respectively, for Me1, and Me2. If indicated, Me1 and Me2 are also alloys, or compounds, or other compositions of these metals with substitution materials; this means, at least one of the mentioned elements can be partially substituted by another element, using a known method. Also, the Cu or the O can be partially substituted.

It is advantageous to select materials for the substrate, which have a structure with unit cell dimensions, representing, at least approximately, the same, or a multiple of, the corresponding dimensions of the axes of the structures of the superconductive high-$T_c$ material, which have grown on them. For this reason, in the case of $YBa_2Cu_3O_{7-x}$, a single-crystal $SrTiO_3$ or $(Ba,Sr)TiO_3$ substrate is especially advantageous. In addition, other materials, such as for example, MgO, $Al_1O_3$, Y-stablilised $ZrO_2$ or $Ta_2O_5$ are also equally suitable. Thereby, the method, according to the invention, is not restricted to single-crystal substrates. Thus, polycrystalline substrates, such as for example, polycrystalline $SrTiO_3$, vapor deposited on a supporting material, can be used. The substrate can be provided, for example, with a relatively small surface and, for example, for an application in the microtechnology area. Moreover, according to the invention, a device can also be developed to implement the method, whereby the device coats an elongated substrate, which has a band-shaped form and is used in the manufacturing of appropriate conductors.

The following is based on a representative, concrete exemplified embodiment of the separation, according to the invention, of a layer of a superconductive material of the known composition $YBa_2Cu_3O_{7-x}$ with an orthorhomic structure on to a single-crystal $SrTiO_3$ substrate. An appropriate device, which is schematically illustrated in a cross-section in the drawing and is generally designated with 2, serves for this purpose. This deposition device contains a vacuum chamber 3, which is to be evacuated through a pump nozzle 4, by means of a corresponding pump (not shown), to a final pressure, which lies, for example below $10^{-6}$ mbar. A laser ray 7 enters into a chamber, through a quartz window 5 of the vacuum chamber 3, and there, under an angle $\alpha$ of, for example, approximately 45°, it strikes a target 8. In the center of the chamber, the target is secured to a support 9, which can be shifted by way of a linkage 10, with the help of a motor. The vaporized material is emitted from the target 8, perpendicularly to the target surface. It condenses on to a substrate 11, located opposite the target. For this purpose, the substrate 11, for example a small plate made of the mentioned material, is attached to a substrate supporting material 12. This substrate supporting material 12 can be heated up to a temperature of at least 800° C. It is retained by a linkage 13, which enables the distance between the target 8 and the substrate 11 to be varied. For example, a distance a can be adjusted between 20 mm and 45 mm. The linkage can be developed further, so that, inside the vacuum chamber 3, another substrate 11, on a substrate supporting material 12, can be exchanged for the substrate 11. During the vaporization process, any partial pressure of oxygen of $p(o_2)$ can be adjusted in the chamber by way of a gas intake 14.

To generate the desired superconductive high-$T_c$ phase of the material in situ during the evaporation step, a pulsed laser with a radiation wavelength of $\lambda$ is advantageously provided, which lies in the uv-spectral region. The wavelength range, which is of interest here, extends from approximately 110 nm to 400 nm. Moreover, the laser must be able to focus a power density of over 3 J/cm² at the material of the target 8. Additionally, the pulse power of the laser must amount to at least 1.5 J/pulse. The mentioned requirements can especially be fulfilled by a generally known XeCl-excimer laser with a radiation wavelength of $\lambda = 308$ nm (compare, for example, "Proc. of SPIE", vol. 735, 1987, article by J.-H. Cirkel et al: "Pulse Power for Lasers"). Its repetition frequency can be, for example, 5 Hz. By way of a focussing optical system, of which only a quartz lens 15 is illustrated in the drawing, a power density of approximately a maximum of 7.5 J/cm² can be generated and provided to the target 8. Generally, power densities of 4 to 5 J/cm² are sufficient. During the vaporization process, the temperature of the substrate 11 must be kept between 600° C. and 800° C., and an oxygen atmosphere is provided in the chamber between 0.02 mbar and 1 mbar. A partial pressure of oxygen $p(o_2)$ of between 0.05 mbar and 0.5 mbar has proven to be especially favorable.

Many times it is still advantageous if one subjects the thus acquired structure to an additional oxygen treatment, in order to finely adjust (charge) the oxygen in the crystal structure of the superconductive layer. Thereby, the oxygen can be supplied as a gas or as a stream of ions. This treatment can be advantageously implemented at relatively low temperatures, in particular below 600° C. If indicated, even temperatures close to room temperature can be used.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A method for manufacturing a layer of an oxide-ceramic superconductor material having a high superconducting transition temperature and high current capacity, on the basis of a cuprate system containing metallic constituents and oxygen, comprising directing a pulsed laser with a wavelength in the ultraviolet spectral range at a target material of the system to vaporize the target material on to a single crystalline or polycrystalline substrate, applying a heat treatment and an oxygen treatment of the deposited material to form a desired superconducting metal-oxide phase with an at least partially ordered crystal structure, the heat treatment and the oxygen treatment being performed simultaneously during the vaporizing step, and comprising the steps of:

providing a power density of the laser radiation directed at the target material of more than $3J/cm^2$;
   providing a pulse power of the laser of at least 12.5 J/pulse;
   raising the temperature of the substrate to a temperature of between 600° C. and 800° C.; and
   providing an atmosphere with a partial pressure of oxygen of between 0.02 mbar and 1 mbar, whereby the desired superconducting metal-oxide phase with a transition temperature of at least 77° K. is at least partially developed in-situ on said substrate.

2. The method recited in claim 1, wherein the step of directing the pulsed laser comprises directing an XeCl - excimer laser at the target material.

3. The method recited in claim 1, wherein the power density of the laser radiation is between 4 and $5 J/cm^2$.

4. The method recited in claim 1, wherein the oxygen atmosphere has a partial pressure of oxygen of between 0.05 mbar and 0.5 mbar.

5. The method recited in claim 1, wherein the substrate is made of a material selected from the group consisting of $SrTiO_3$, $Al_2O_3$, $ZrO_2$, and $MgO$.

6. The method recited in claim 5, wherein the substrate is provided with a texture adapted to the crystal structure of the superconducting metal-oxide phase to be manufactured.

7. The method recited in claim 1, further comprising applying an additional oxygen treatment at a temperature below 600° C. after the vaporizing step.

8. The method recited in claim 1, wherein an oxide-ceramic superconducting material comprises the constituent Me1 which includes at leas a rate earth metal or yttrium, and the constituent Me2 which includes an alkaline-earth metal.

9. A method of forming an oxide superconducting thin film by laser deposition, the method comprising:
   1) providing a target in a vacuum chamber, the target material having a stoichiometric composition of a desired oxide superconducting film to be formed on a substrate;
   2) heating the substrate in the chamber to a temperature of 600° to 800° C.;
   3) maintaining an oxygen partial pressure of between 0.02 mbar and 1 mbar during the deposition in the vacuum chamber; and
   4) directing a laser beam at the target to vaporize the target material and to deposit the desired oxide superconducting film on the substrate without further heat treatment.

10. The method recited in claim 9, wherein directing a laser beam at the target further includes directing a beam of a pulsed laser at the target material.

11. The method recited in claim 10, wherein directing the beam of the pulsed laser at the target material includes directing a beam of an XeCl - excimer laser at the target material.

12. The method recited in claim 10, wherein power density of laser radiation that is directed at the target material is more than $3 J/cm^2$.

13. The method recited in claim 12, wherein the laser radiation that is directed at the target material is between 4 and $5 J/cm^2$.

14. The method recited in claim 10, wherein pulse power of laser radiation directed at the target material is at least 1.5 J/pulse.

15. The method recited in claim 9, wherein the oxygen partial pressure is between 0.05 mbar and 0.5 mbar.

16. The method recited in claim 9, wherein the substrate is a material selected from the group consisting of $SrTiO_3$, $Al_2O_3$, $ZrO_2$, and $MgO$.

17. The method recited in claim 16, wherein the substrate has a texture adapted for a crystal structure of a superconducting metal-oxide phase to be manufactured.

18. The method recited in claim 9, wherein an oxide superconducting material according to a Me1-Me2-Cu-O system includes the metallic constituent Me1 which is at least a rare earth metal or yttrium, and the metallic constituent Me2 which is an alkaline-earth metal.

* * * * *